United States Patent
Crockett et al.

[11] Patent Number: 5,882,468
[45] Date of Patent: Mar. 16, 1999

[54] THICKNESS CONTROL OF SEMICONDUCTOR DEVICE LAYERS IN REACTIVE ION ETCH PROCESSES

[75] Inventors: John G. Crockett, Brookfield, Conn.; Bardia Pezeshki, San Jose, Calif.; Robert L. Sandstrom, New Canaan, Conn.

[73] Assignee: International Business Machines Corporation, Armonk, N.Y.

[21] Appl. No.: 804,600

[22] Filed: Feb. 24, 1997

Related U.S. Application Data

[60] Provisional application No. 60/012,190 Feb. 23, 1996.
[51] Int. Cl.$^6$ .................................................... C23F 1/02
[52] U.S. Cl. ........................ 156/345; 118/723 E; 118/729
[58] Field of Search ........................ 156/345; 118/723 E, 118/723 ER, 723 IR, 723 MA, 723 ME, 723 MR, 723 MW, 723 R, 729; 204/298.15

[56] References Cited

U.S. PATENT DOCUMENTS

| | | | |
|---|---|---|---|
| 4,303,489 | 12/1981 | Morrison, Jr. ...................... | 204/192.12 |
| 4,358,686 | 11/1982 | Kinoshita .............................. | 250/492.2 |
| 4,608,943 | 9/1986 | Doehler et al. .......................... | 118/718 |
| 4,957,061 | 9/1990 | Ando et al. .............................. | 118/719 |
| 5,149,375 | 9/1992 | Matsuyama .............................. | 118/719 |
| 5,306,408 | 4/1994 | Treglio ................................. | 204/192.38 |
| 5,423,971 | 6/1995 | Arnold et al. ....................... | 204/298.11 |
| 5,591,313 | 1/1997 | Barber, Jr. et al. ................ | 204/192.12 |
| 5,714,010 | 2/1998 | Matsuyama et al. ........... | 118/723 MW |

OTHER PUBLICATIONS

Sandstrom, R.L. et al., Moveable–mask reactive ion etching process for thickness control in devices, Appl. Phys. Lett. 69 (15), 2163–2165, Oct. 7, 1996.

*Primary Examiner*—R. Bruce Breneman
*Assistant Examiner*—Allan Olsen
*Attorney, Agent, or Firm*—Stephen S. Strunck

[57] ABSTRACT

By moving a substrate relative to a shadow mask in a reactive ion etching system, we are able to precisely tailor the thickness of critical layers. To minimize disturbing the plasma, all the mechanical components are kept below the anode. The system is highly reproducible, and can be programmed to yield arbitrary vertical profiles along one horizontal axis. Using silicon-on-insulator substrates, the resonance wavelength was modified as a function of position with better than 1 nm control in the vertical dimension. This technique should prove useful for optical devices where the thickness of the layers controls the device characteristics.

8 Claims, 3 Drawing Sheets

THICKNESS CONTROL OF SEMICONDUCTOR DEVICE LAYERS IN REACTIVE ION ETCH PROCESSES

CROSS-REFERENCE TO RELATED APPLICATIONS

The present application claims priority to U.S. Provisional Application 60/012,190 filed Feb. 23, 1996, now abandoned.

DESCRIPTION

BACKGROUND OF THE INVENTION

While lateral patterning of semiconductors is readily obtained through photolithography, there is a need for an improved method to vary the thickness or composition of layers along a device. A simple technique to controllably adjust the vertical dimension would be extremely useful for many optical devices. For example, in Vertical Cavity Surface-Emitting Lasers (VCSELs), or resonant cavity photodetectors, the thickness of the resonator controls the wavelength, and by varying this thickness along a device or in any array, multiple wavelength operation can be achieved.

The simplest method for varying the thickness along a wafer is by relying on growth-induced non-uniformities. This method has been used to yield multiple wavelength layer arrays and LEDs. A more advanced technique, selective area epitaxy, uses an oxide mask to shield part of the wafer during metalorganic chemical vapor deposition (MOCVD) growth and thus cause an increased growth rate on the un-masked portions. This method has been successfully used to form waveguide laser arrays and in a modified form used for vertical cavity lasers. Another technique in molecular beam epitaxy (MBE) uses local heating to decrease the growth rate to yield a somewhat controllable taper in the thickness. Masks have also been used in an MBE chamber to shield parts of the wafer during growth and give discrete changes in the thickness. Finally, repeated lithographic and etching steps have also been used for multiple wavelength arrays.

SUMMARY OF THE INVENTION

The present invention provides a very simple and powerful method to adjust the thickness of layers for electronic devices, especially optical devices. Rather than rely on delicate changes in the growth rate or use multiple lithographic steps, we use a standard reactive ion etch (RIE) process on a uniform wafer, and adjust the etch at different positions by moving the substrate relative to a shadow mask. The amount of time each area is exposed to the plasma determines the total etched amount, and can be adjusted using a computer controlled stepper motor. Such a technique had previously been considered difficult, since shutters and other mechanical parts disturb the plasma and cause uncontrollable changes in the etch rate. This problem is avoided in our process by keeping all the mechanical components under the anode, and then moving the substrate while keeping the mask fixed.

BRIEF DESCRIPTION OF THE DRAWINGS

The foregoing and other aspects and advantages of the invention will be better understood from the following detailed description of the invention with reference to the drawings, in which.

DETAILED DESCRIPTION OF THE INVENTION

Figure 1:
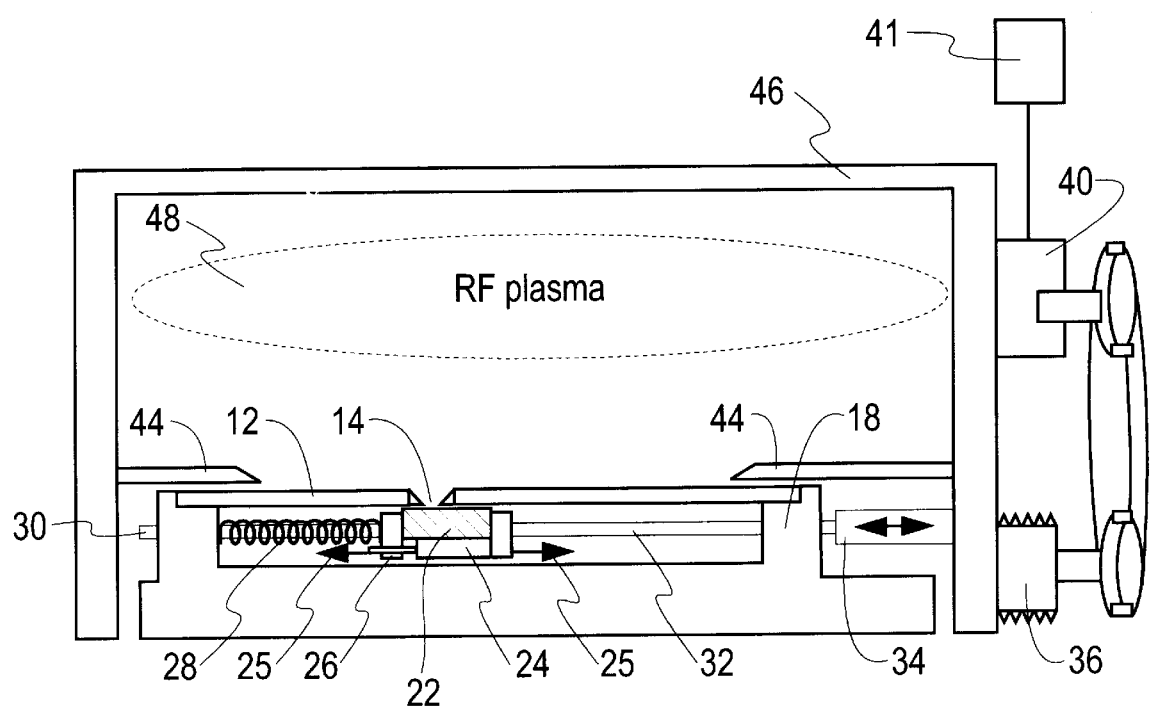
FIG. 1 is a schematic of a modified reactive ion etch chamber used in the practice of the invention.

A cross section of the experimental setup 10 is shown in FIG. 1. The anode of a PlasmaTherm Batchtop RIE chamber was modified as shown. A computer controlled stepper motor turns a rotary feedthrough through one of the access ports and moves a micrometer screw that in turn laterally moves a spring loaded chuck that holds the substrate. The anode plate was modified to accept various masks with various size slots or openings. Since the anode plate remains fixed, the rotary feedthrough changes the relative horizontal position between the mask in the anode plate and the substrate. The spacing between the mask and the substrate was fixed at about 200 microns. Since the exposed substrate is etched by the plasma, the thickness of critical layers can be varied across the substrate. This arrangement thus incorporates a flat plate mask which is located flush with the Rf electrode surface so as not to disturb the dark space region of the Rf plasma. Therefore, plasma translational symmetry and plasma conductivity are preserved. Also, there are no plasma perturbations since the mask is flat and the mechanisms, which are part of the overall anode structure, are electrically isolated and are located beneath the anode surface. Included within the term reactive ion etching are variants thereof, such as magnetron reactive etching (MRIE), reactive ion beam etching (RIBE), high density plasma etching (HDP) transformer coupled plasma etching (TCP), inductively coupled plasma etching (ICP) and electron resonance plasma etching (ECR).

More specifically, the normally solid (except for cooling water passages) Rf anode was modified to hold a mask piece and a mechanism to move a wafer (substrate or device) beneath the mask. Thus, mask piece 12 with an aperture (e.g., slit, slot or wide edge groove) 14 located therein was screwed down into a recess in the Rf anode 18. Beneath piece 12 is the mechanism for moving wafer 22. Wafer 22 sits in a pocket or recess in wafer stage 24 flush to mask piece 12 and is held by a clamp arrangement (not shown) on wafer stage 24 which is attached to a slide mechanism arrangement 26. Slide mechanism 26 has a spring 28 which surrounds a centering rod 30 on one end and has push rod 32 on the other end. By pushing push rod 32 in and out via arm rod 34 and via rotary ferrofluidic feedthru 36, slide mechanism 26 and wafer stage 24 move back and forth (as indicated by arrows 25) with very little resistance under mask opening 14. Pressure from spring 28 keeps pressure on slide mechanism 26; therefore, no slippage occurs. Stepping motor 40, which is programmable, is geared to a specific ratio (e.g., 4:1) and is connected via feedthru 36 through a hole in the wall of chamber 46 to arm rod 34. This moves wafer 22 with resolution on the order of 5 angstroms at a constant or variable speed with specific timing sequences, if desired. Movement may also be in time varied or in incremental steps. Such sequences and steps may be computer controlled by means of one or more computer programs in a computer (e.g., computer 41). Dark space shield 44 sits above and partially covers the mechanism and mask 12. The top surface of wafer 22 either touches the bottom of mask piece 12 or is displaced a few thousandths of an inch from the bottom surface of mask 12.

Though such a system can be used for various materials, and multiple wavelength VCSEL arrays should be possible in GaAs, we first characterized the system using a more conventional silicon etching process. Silicon-on-insulator (SOI) substrates have previously been used for resonant cavity detectors and wavelength selective waveguide devices. These substrates are available commercially from various vendors, and contain a buried layer of $SiO_2$ that acts as an insulating layer for electronic applications. For optoelectronics, the SOI substrate acts as a Fabry-Perot resonator, with the buried oxide forming one mirror while the silicon-air-interface forms the other mirror of the cavity. The thickness of the silicon once again controls the wavelength of operation, and etching this layer causes the resonance to shift to shorter wavelengths.

Avoiding chlorine chemistry, we used a mixture of bromotrifluoromethane ($CF_3Br$) and sulfur hexafluoride ($SF_6$) for the plasma. Optimum smoothness was obtained with about 25% $SF_6$ composition (by volume). The pressure was maintained at 1 mTorr to give an etch rate of 50 nm/min at 50 Watts power. The dark space in the plasma was very uniform and about 1 cm in thickness. Since this dimension is far greater than the thickness of the mask and the spacing between the mask and the wafer, there was negligible disturbance of the plasma, producing uniform and nearly vertical etching.

SOI substrates were used with a 1 micron thick silicon layer on top of a 1 micron oxide layer. The resonance wavelength was monitored before and after etching by taking the reflectivity spectrum of the substrate. White light from a tungsten lamp was focused on the wafer at normal incidence and then coupled through a fiber to an optical spectrum analyzer (OSA). A computerized method was set up to laterally move the wafer and measure the reflectivity spectrum of a 100 micron spot. The resonance position was then indicative of the layer thickness.

Figure 2:
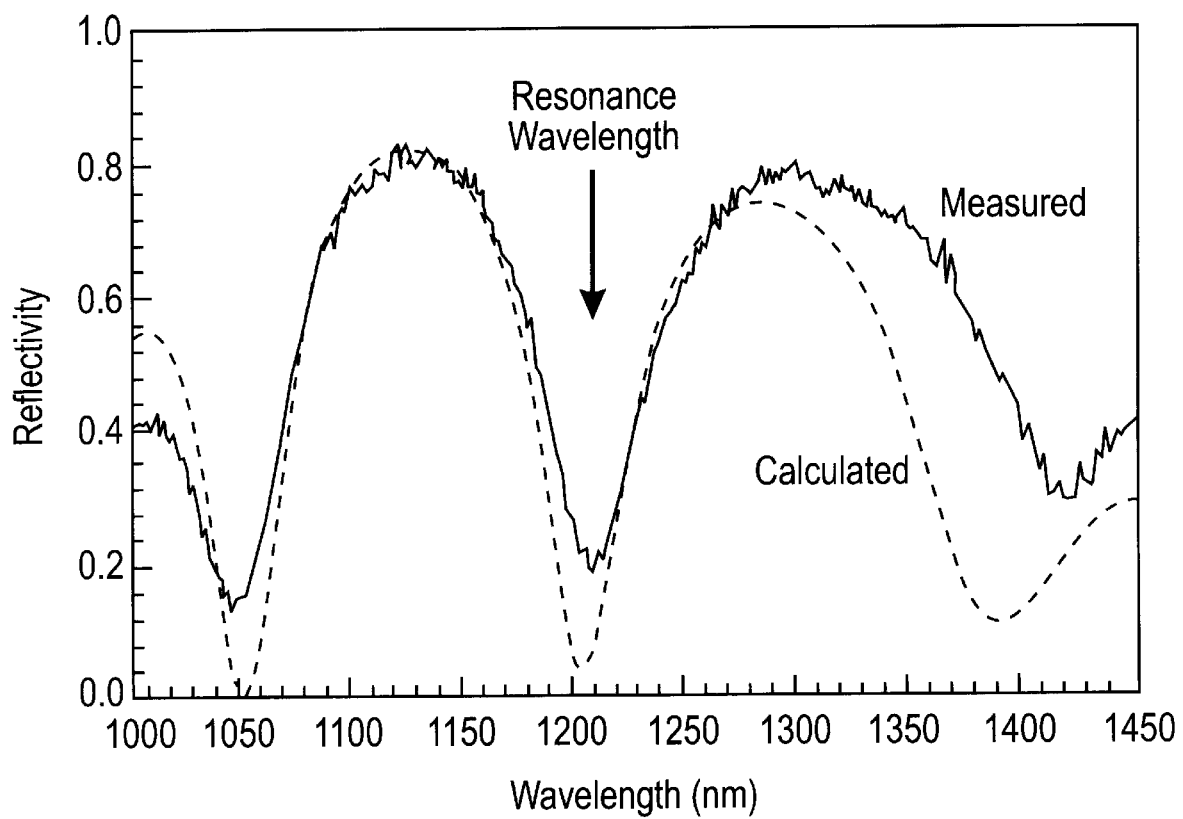
FIG. 2 is a graph showing both the measured and calculated reflectivity of a silicon-on-insulator substrate before processing by the method of the invention.

FIG. 2 shows both the measured and the calculated reflectivity of the SOI substrate before processing. The SOI substrate shows a resonance wavelength that is a function of the silicon thickness This resonance is caused by the buried oxide and the silicon-air interface acting as the two mirrors of a Fabry-Perot cavity. A Fabry-Perot resonance is evident at about 1200 nm. The sample was then placed in the RIE chamber and steps were etched, aiming for 5 nm steps every 500 microns to give a total of 20 steps. The change in the resonance wavelength as a function of position was then measured using the computerized reflectivity setup and the thickness values were derived from the resonance positions. As a first approximation, we neglected variations of refractive index with wavelength around the resonance, and normalized the unetched thickness of the silicon to the nominal value of 1 micron.

Figure 3:
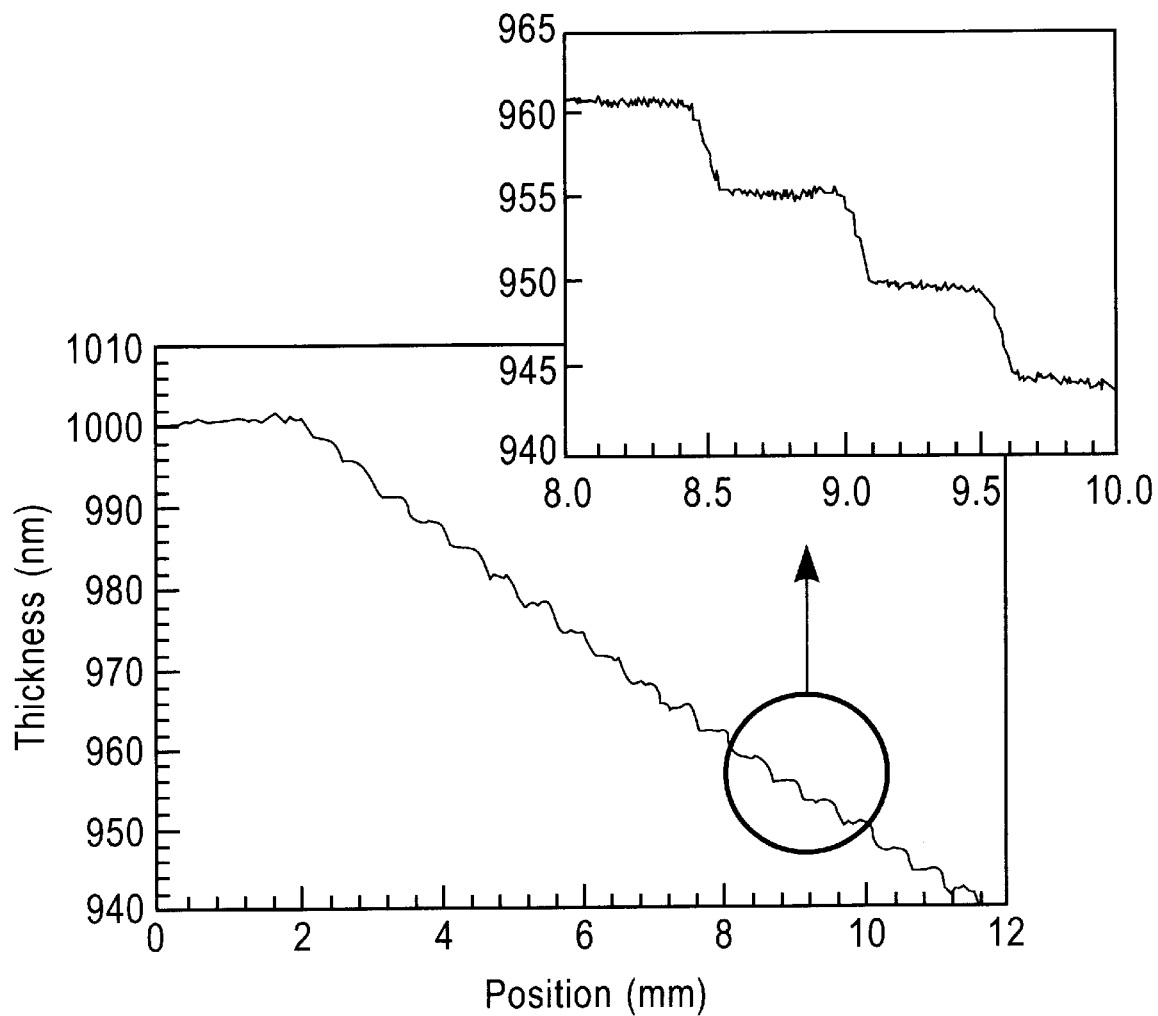
FIG. 3 is a graph of the thickness variations obtained on a silicon-on-insulator substrate by the method and apparatus of the invention.

FIG. 3 shows the thickness variations (profiles) of one such sample using the technique of the invention. Clearly there is good agreement with the desired thickness values. The slope of each step is limited by the speed of the stepper motor, since it took a finite amount of time to move the substrate from one location to another. Reducing the etch rate or increasing the speed of the motor would increase the flatness of the steps. The slope of each step edge seen in FIG. 3 is limited in the measurement process by the spatial resolution of the setup, which is in turn determined by the brightness of the white light source and the sensitivity of the OSA. A higher spatial resolution would require tighter focusing that limits the light coupled to the fiber. In the measurement setup a spatial resolution of 100 microns was required to give a thickness error of less than 0.5 nm.

Such a computer controlled etching system is capable of forming arbitrary vertical profiles, and is not limited to steps. There is a trade-off between total process time and the required horizontal resolution, since using a finer slot requires a longer etch time. The process could also be extended to two dimensions if motion control (e.g., by the use of piezoelectric transducers) is added along the other axis (i.e., direction perpendicular to arrows 25). However, for arbitrary profiles, one would then require a small square opening instead of a slot with a concurrent increase in the overall etch time. Such a system would then resemble an ion-beam system, with the beam coming through the opening and scanning across the wafer. It is important to note that unlike optical lithography, the system is not limited in resolution in the horizontal direction.

In summary, we have described a mechanical method of varying the relative position of a substrate to a shadow mask during an RIE process. This allows arbitrary thickness profiles to be realized, controllably varying critical dimensions within a device or an array. Such a technique should prove very useful for multiple wavelength optical devices where the thickness of a particular layer controls the operating wavelength of the device.

While the invention has been described herein with reference to specific aspects, features and embodiments, it will be apparent that other variations, modifications and embodiments are possible, and all such variations, modifications and embodiments therefore are to be regarded as within the spirit and scope of the invention.

What is claimed is:

1. An apparatus for forming predetermined profiles in semiconductor devices comprising:
   a. a spring-loaded translatable substrate mechanism for holding a substrate, said substrate mechanism being situated beneath a mask piece, said mask piece having an aperture therein;
   b. means for translating said substrate mechanism back and forth beneath said aperture;
   said mask piece and said mechanism being a part of the anode of a reactive ion etching device and being situated within a chamber.

2. The apparatus of claim 1 further including means for moving said substrate mechanism in a direction perpendicular to said back and forth direction.

3. The apparatus of claim 1 wherein said means for translating includes a stepper motor connected to said translating means through a rotary feedthrough through a hole in a wall of said chamber.

4. The apparatus of claim 3 wherein said stepper motor is controlled by means of a program in a computer.

5. The apparatus of claim 4 wherein said program provides for incremental movement of said substrate beneath said aperture.

6. The apparatus of claim 4 wherein said program provides for continuous movement of said substrate beneath said aperture.

7. The apparatus of claim 4 wherein said program provides for time varied movement of said substrate beneath said aperture.

8. The apparatus of claim 1 wherein said mask and said translatable mechanism are at least partially located beneath a dark space shield.

* * * * *